(12) United States Patent
Indermuehle et al.

(10) Patent No.: US 8,110,801 B2
(45) Date of Patent: Feb. 7, 2012

(54) LAYERED SCANNING CHARGED PARTICLE MICROSCOPE PACKAGE FOR A CHARGED PARTICLE AND RADIATION DETECTOR

(75) Inventors: Scott W. Indermuehle, Danville, CA (US); Charles S. Silver, Richmond, CA (US); James P. Spallas, Alamo, CA (US); Lawrence P. Muray, Moraga, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 132 days.

(21) Appl. No.: 12/718,940

(22) Filed: Mar. 5, 2010

(65) Prior Publication Data

US 2010/0224779 A1 Sep. 9, 2010

Related U.S. Application Data

(60) Provisional application No. 61/157,556, filed on Mar. 5, 2009.

(51) Int. Cl.
*H01J 37/28* (2006.01)
*G01N 23/22* (2006.01)
(52) U.S. Cl. ...... 250/311; 250/310; 250/397; 250/492.3
(58) Field of Classification Search .............. 250/306, 250/307, 309, 310, 311, 396 R, 396 ML, 250/297, 398, 423 R, 424, 492.1, 492.2, 492.3, 492.21, 494.1, 580
See application file for complete search history.

(56) References Cited

U.S. PATENT DOCUMENTS

| | | | |
|---|---|---|---|
| 6,003,952 A | 12/1999 | Smart et al. | |
| 7,109,486 B1 * | 9/2006 | Spallas et al. | 250/311 |
| 7,335,895 B1 * | 2/2008 | Spallas et al. | 250/396 R |
| 8,003,952 B2 * | 8/2011 | Muray et al. | 250/396 R |
| 2007/0138404 A1 * | 6/2007 | Frosien et al. | 250/398 |
| 2008/0054180 A1 * | 3/2008 | Silver et al. | 250/307 |
| 2008/0217531 A1 * | 9/2008 | Muray et al. | 250/307 |
| 2009/0020698 A1 * | 1/2009 | Muto et al. | 250/310 |
| 2010/0224777 A1 * | 9/2010 | Spallas et al. | 250/307 |
| 2010/0224778 A1 * | 9/2010 | Muray et al. | 250/307 |
| 2010/0294931 A1 | 11/2010 | Zarchin et al. | |
| 2010/0294937 A1 * | 11/2010 | Finch et al. | 250/340 |

OTHER PUBLICATIONS

Notice of Allowance dated Oct. 12, 2011 in U.S. Appl. No. 12/717,919.
Notice of Allowance dated Sep. 30, 2011 in U.S. Appl. No. 12/717,901.

* cited by examiner

*Primary Examiner* — Bernard E Souw (57) ABSTRACT

A scanning charged particle microscope includes a layered charged particle beam column package; a sample holder; and a layered micro-channel plate detector package located between the column package and the sample holder.

20 Claims, 5 Drawing Sheets

LAYERED SCANNING CHARGED PARTICLE MICROSCOPE PACKAGE FOR A CHARGED PARTICLE AND RADIATION DETECTOR

PRIORITY REFERENCE TO PRIOR APPLICATIONS

This application claims benefit of and incorporates by reference U.S. patent application Ser. No. 61/157,556, entitled "Layered Package For A Charged Particle Beam And Radiation Detector," filed on Mar. 5, 2009, by inventors Scott W. Indermuehle et al.

TECHNICAL FIELD

This invention relates generally to scanning electron microscopes (SEMs), and more particularly, but not exclusively, provides an apparatus and method for detecting charged particles and radiation in a charged particle microscope column using micro-channel plates (e.g., in miniature, table top, portable SEMs, etc.).

BACKGROUND

Charged particle detectors, and, in particular, electron detectors are critical for high-contrast image formation from secondary electrons in SEMs. Conventional detectors used to detect secondary electrons have large dimensions. Miniature electron beam (E-beam) columns have small, closely spaced apertures and lens components, and all components are in close proximity to the sample. These characteristics make it difficult to mount conventional secondary electron detectors in miniature E-beam columns and achieve the high collection efficiencies required for good signal-to-noise ratios.

An Everhart-Thornley detector (ETD) is a device commonly used for collecting secondary and backscattered electrons in SEMs. An ETD comprises a biased collector grid surrounding a scintillator material, which is coupled to a photomultiplier to provide a first stage of amplification. ETDs can be mounted in SEMs as "in-lens" detectors, situated within the column above a pole piece. This type of detector configuration can be used to detect electrons that are ejected from a sample and drift back up the column. The ETD is also commonly positioned beneath the pole piece in proximity to the sample to detect both backscattered electrons and secondary electrons.

However, the large size of the ETD makes it impractical for "in-lens" mounting in a miniature electron beam column because the lenses are typically separated by 0.1-10 mm, which is small compared to the dimensions of the ETD detector. Mounting the ETD below the pole piece restricts the working distance. ETDs are further limited by their small solid angle for collecting incident electrons. This results in relatively poor collection efficiency, and thus inferior signal-to-noise ratios for a given beam current.

Micro-channel plate (MCP) detectors are also used for detecting secondary and backscattered electrons in SEMs. MCPs are constructed of a grid of channels, typically 1-100 um in diameter, and often oriented at a slight angle to the incident beam. When a voltage is applied between the top and bottom of channel plates, incident electrons are accelerated and multiplied, resulting in current gain. The thickness of the MCP is typically 0.4 mm or greater to achieve sufficient gain. In fact, for high-contrast imaging, MCPs are often stacked together in a dual chevron configuration to increase the overall detector gain. However, when packaged using conventional techniques, a dual stack limits the SEM's working distance.

Accordingly, a new apparatus and method are needed for detecting radiation and charged particles in a miniature SEM.

SUMMARY

Embodiments of the invention provide a detector, using an MCP, having a high collection efficiency even when located very close to the sample; having minimal impact on working distance and does not distort the incident beam; and being small, thin, and easily integrated with a miniature charged particle-beam column.

Micro-Channel Plates (MCPs) are commonly used as charged particle and radiation detectors because of their high gain, high contrast, and low background noise. MCP gain is a function of channel aspect ratio. An MCP of 0.4 mm thickness with a channel aspect ratio of 60 can achieve a gain of approximately $10^4$. If stacked and properly aligned, two MCPs can be used to achieve a gain of approximately $10^7$.

The mounting configuration and signal-to-noise characteristics of the MCP electron detector in a Scanning Electron Microscope (SEM), and in particular, SEMs that use the electron beam column package described in U.S. Pat. No. 7,109,486, which is hereby incorporated by reference, to miniaturize the system, are critical for high-contrast imaging of secondary electrons emitted from the sample. The tight lens spacing in miniature electron beam columns prevent the use of conventional secondary electron detectors.

Embodiments of the invention include a package and detector configuration optimized for use with a miniature charged particle-beam column. The package and one or more MCPs, collectively called the detector, are designed with an aperture to allow a primary charged particle beam to pass through. The detector has an overall thickness of less than 1.3 mm when configured with two MCPs (dual) and less than 1.0 mm when configured with a single MCP. The detector comprises a plurality of layers with at least one layer having a collector for collecting electrons. The collector may be composed of a single contiguous region or n-number of electrically isolated segments. For example, the collector may contain four quadrants comprising electrically isolated segments placed with mirror symmetry about a central aperture or n-number of electrically isolated annular segments concentric with a central aperture and with one another. In addition, the collector can be a patterned metal plate or plates or can alternatively be an active device like a CCD or CMOS cell.

Because the detector can be made very thin, it can be easily integrated with miniature charged particle beam columns. SEM resolution is improved at shorter working distances, so a thin detector enables high performance. For a given working distance, a thinner detector enables higher collection efficiency, which results in improved image contrast. The layered technologies used to fabricate the detector package provide a straight forward technique to create interconnections and other features, like collectors, and allows integration of devices, enabling customization of the detector package for a variety of applications.

In an embodiment, a scanning charged particle microscope includes a layered charged particle beam column package; a sample holder; and a layered micro-channel plate detector located between the column package and the sample holder.

In an embodiment, a method, comprises: generating a charged particle beam; focusing the beam with a charged particle beam column onto a sample, the column having a layered charged particle beam column package; a sample holder holding the sample; and a layered micro-channel plate detector located between the column package and the sample holder; scanning the beam over a target; and detecting charged particles from the sample with the detector.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Embodiments of the invention provide a package and MCP detector configuration optimized for use with a miniature SEM. The package and one or more MCPs, collectively called the detector, has an overall thickness of less than about 1.3 mm when configured with two MCPs (dual) and less than about 1.0 mm when configured with a single MCP. The detector has an aperture to allow a charged particle beam to pass through unobstructed. The package is made using a layered technology, like, for example, Low Temperature Co-Fired Ceramic (LTCC) or High Temperature Co-Fired Ceramic (HTCC). In one embodiment of the invention, the package is comprised of a plurality of layers, some with interconnects or components attached, for example, an MCP. Other devices, such as amplifiers, can be integrated with the package to improve performance and reduce costs.

Figure 1:
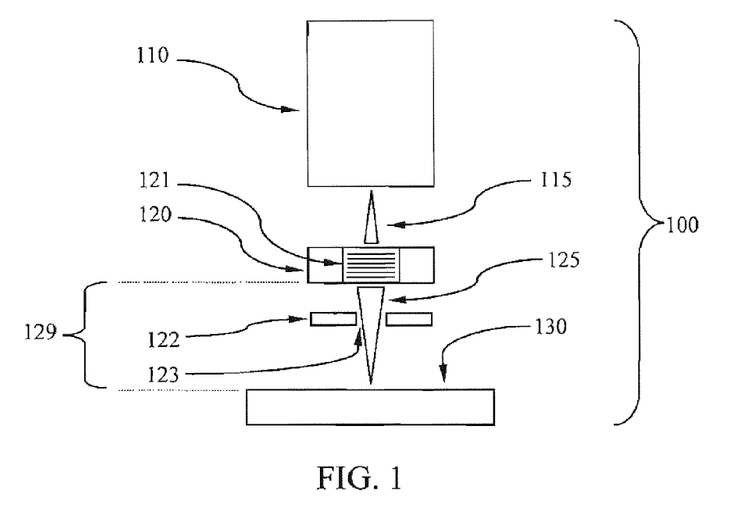
FIG. 1 is a block diagram illustrating an apparatus incorporating a charged particle column assembly having a detector according to an embodiment of the invention.

FIG. 1 is a block diagram illustrating an apparatus 100 incorporating, in this embodiment, a charged particle beam column package 120. In embodiments of the invention, the apparatus 100 includes scanning charged particle microscopes, lithography, inspection, and/or analysis tools. The apparatus 100 includes a charged particle source 110 (cathode), such as a thermal field emitter (TFE), positioned adjacent to the beam column package 120, which supports lenses, deflectors, blankers, magnetic or electrostatic, and other elements required for the column operation (heretofore components 121). The beam column package 120 and components 121 form the column package assembly which is positioned adjacent to a sample holder 130. In an embodiment of the invention, the charged particle source 110 is positioned above the beam column package 120 and the sample holder 130 is positioned below the beam column package 120.

In an embodiment of the invention, the charged particle source 110 emits electrons 115 by field assisted thermionic emission. The charged particle source 110 can also comprise a Tungsten or $LaB_6$ filament, or any of a multitude of cold field emitters, including carbon nanotubes and microfabricated field emission tips. The electrons 115 can have an energy ranging from a few hundred eV to up to about 5 keV. The components 121 coupled to the beam column package 120 extract, collimate, and focus the electrons 115 into a charged particle beam 125, which is emitted from the package assembly as a charged particle beam 125. The column package assembly scans the focused beam 125 over the sample holder 130 through a detector aperture 123 of a detector 122, which is located beneath or coupled to the bottom of the beam column package 120.

In an embodiment in which the apparatus 100 includes a scanning charged particle microscope, the sample holder 130 holds an object for imaging. The charged particle beam 125 strikes the object causing the emission of electrons, some of which travel back to a detector 122, and are used to generate an image of the object.

A critical dimension of the apparatus 100 is the working distance 129, which is the distance between the final lens in the components 121 and the sample 130. The spatial resolution of E-Beam columns can be improved by minimizing the working distance 129. It is clear from FIG. 1 that in the case where the detector is placed between the sample 130 and components 121, the shortest achievable working distance is limited by the total detector thickness. A thinner detector 122 therefore enables shorter working distance, resulting in improved E-Beam performance.

Figure 2:
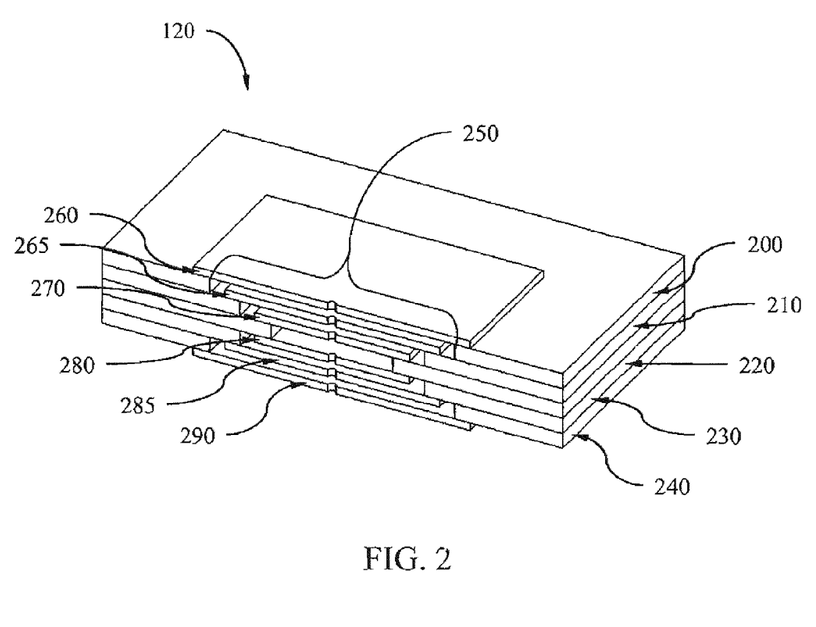
FIG. 2 is a perspective view illustrating a charged particle beam column package assembly according to an embodiment of the invention.

FIG. 2 is a perspective view illustrating a charged particle beam column package 120 according to an embodiment of the invention. The beam column package 120 eliminates individually wired interconnects common to conventional scanning electron microscopes and lithography devices and replaces them with high density, batch-processed, printed circuitry. This is achieved using low temperature co-fired ceramic (LTCC) using, for example, materials from DuPont (e.g., 951 or 943) or Ferro (e.g., A6-S or A6-M), or high-temperature co-fired ceramic (HTCC) using, for example, materials from Kyocera, polyimide, or any other layering technology that produces a rigid package. The beam column package 120 is built layer by layer, up to 30 layers or more, and has interconnects strategically distributed on each layer using high-resolution pattern transfer, thereby yielding up to 60 surfaces or more for patterning and enabling the exposed surfaces to be reserved for termination pads for contact to flexible printed circuit (FlexPC) connectors or other high density interfaces. In contrast, miniature columns fabricated using alternative technologies have incorporated platforms or packages with significantly fewer surfaces for patterning. Each beam column package 120 is electrically tested and burned in before shipping, thereby improving yield and reliability.

In an embodiment in which some or all of the components 121 are fabricated based on silicon processing techniques, a beam column package 120 fabricated from layered technology, such as LTCC, significantly reduces assembly time and overall complexity as well as increases reliability and yield of the individual lens elements. Isolating elements are incorporated in to the beam column package 120, thereby eliminating bonded glass spacers or other isolation elements that are individually attached to each lens or component before packaging.

Other advantages of using LTCC or HTCC technology include the ability to batch process and fabricate in high volume; fabrication at very low cost; packages with assembled components can be 100% electrically tested before shipping and are extremely reliable; packages provide a significant increase in real estate available for printed interconnects, ground planes, strip lines, impedance matched lines, embedded active and passive devices, external active and passive devices; GHz drivers placed close to the components 121; packages are ultrahigh vacuum compatible; packages are rigid and durable; supporting low-loss high-speed interconnects (>1 GHz) because layered materials, such as LTCC, have low dielectric constants; supporting low-loss high-speed interconnects (>1 GHz) by enabling printing strip-lines and micro-strip-lines; hermetically sealing internal interconnections to prevent reliability failures and provide back to front vacuum isolation; lithographically printing interconnections with good resolution and registration; sufficient real estate for redundancy, scaling, or the addition of electronics or either passive (e.g., resistors, capacitors) or active devices; and high density connectors can easily be integrated with the column.

The column package assembly comprises a beam column package 120 with five layers 200-240 stacked one on top of another and six components 121, shown as 260-290 in FIG. 2. Each layer of the beam column package 120 can have one or more components coupled to it (one per side). In an embodiment of the invention, the component 260 is coupled to a top surface of the layer 200; component 265 is coupled to the top surface of the layer 210, components 270 and 280 are coupled to a top and a bottom surface, respectively, of the layer 220; the component 285 is coupled to a bottom surface of the layer 230; and the component 290 is coupled to a bottom surface of the layer 240. In other embodiments of the invention, the beam column package 120 can comprise a different number of layers and/or contain a different number of components. A component can include a single device like, for example, a silicon lens element, or a stack of devices like, for example, silicon lenses electrically isolated by an insulator like, for example, Pyrex. The number of devices in a stack not limited.

The top and bottom surface of the layers 200-240 are available for printed circuitry. Each electrical interconnect can be made to terminate at a pad on the top of the layer 200, the bottom of the layer 240, or any other surface within the beam column package 120. Electrical connections between layers are made as needed by vias in the layers 200-240. Connection to external power supplies can be made using, for example, FlexPC interconnects.

Pads can be printed on each layer 200-240 to allow each component 260-290 to be attached and electrically connected using either manual techniques or production assembly techniques like, for example, a bump or ball bonding. Each component 260-290 of the column package assembly is aligned and attached directly to the beam column package 120. The precise alignment needed can be done using marks printed on each component 260-290 and layer 200-240. The beam column package 120 can have cutouts to view the marks and registration features when the assembly is completed to perform or verify alignment. Pads printed on the top-most layer 200, bottom-most layer 240, or any other layer whereby a cutout is made to expose a surface can be used for attaching a high density connector or other high density interfaces to the package using either manual techniques or production assembly techniques like, for example, a bump or ball bonding or soldering. Advantages of using this method may include: ease of assembly, less labor intensive, and better reliability than other techniques used including anodic bonding and epoxy. LTCC is a mature technology that allows batch processing, printed interconnects, and 100% electrical and mechanical testing of the components and subassemblies. The assembly can be done in high volume production using a variety of techniques. There is no contamination or other reliability problem. Layered processing achieves smooth, flat, and parallel surfaces for component attachment. The layer thickness is very well controlled. Electrical connection to a large number of pads is possible. LTCC, HTCC, and other layered processes are compatible with lapping and polishing processes which can be used to create packages with extreme parallelism (TTV), flatness, and smoothness.

Each layer 200-240 can be made square shaped (or otherwise shaped) with one or more square, or otherwise, shaped cutouts to enable placement of a component, transmission of electrons, or other function. Components 260-290 may include discrete elements like lenses, deflectors, blankers, etc., or assemblies of elements such as fabricated lenses or deflector stacks. Layers can vary in thickness, for example from about 3.7 to about 8.2 mils for LTCC and significantly more for HTCC and polyimide processes. Each layer 200-240 can have the same thickness or their thicknesses can vary from each other.

The beam column package 120 has, in an embodiment, a shape designed to minimize the overall package size and maximize the real estate available for mounting components. In this embodiment, the cutouts decrease in at least one dimension when starting from the top layer 200 or bottom layer 240 and moving toward the center layer 220, which allows placement of each component 260-290 into its' corresponding layer. The minimum dimension of the cutout 250 is determined by the minimum practical size of component 265, and is also tightly coupled with the size of cutouts and components located in adjacent layers.

Figure 3:
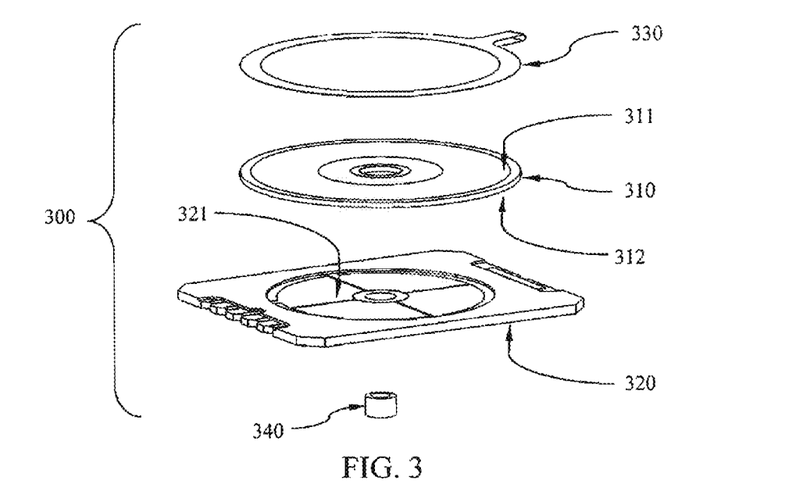
FIG. 3 is an exploded view illustrating a single plate MCP detector.

FIG. 3 is an exploded view showing one embodiment of a detector 300 in which only a single MCP is used. The detector 300 comprises a detector package 320 that can accommodate a single MCP 310 or dual MCPs. In another embodiment, additional MCPs can be added. The MCP 310 includes a bias electrode 311 (bias) and a high voltage electrode 312. A collector 321 is also located on the detector package 320. The MCP bias can be positive or negative and is adjusted to attract or repel secondary electrons as needed. A bias contact tab 330 adjacent and/or above the MCP 310 provides continuity to the detector package 320 for interconnect purposes. An aperture 340 in the center of the MCP 310 allows unobstructed passage of the scanning charged particle beam 125. In one embodiment in which the MCP detector is collecting secondary and backscattered electrons, the bias electrode 311 is at about 50V, the high voltage electrode 312 is at about 1100V, and the collector 321 is at about 1200V. In another embodiment in which the detector is collecting only backscattered electrons, the bias electrode 311 is at about −50V, the high voltage electrode 312 is at about 1100V, and the collector 321 is at about 1200V.

The collector 321 can be of various geometries containing any number of segments, each operated independently. As such, any combination of segments can be made to collect electrons and the current from any segment or combination of segments can be subtracted from the current from any other combination of segments, each segment arbitrarily shaped and positioned. If needed, additional layers may be added to the detector package 320 to provide surfaces for making electrical connection to each individual segment.

The collector 321 is created using processes standard to the layering technology used. Each segment of the collector 321 collects electrons as the probe current scans over the sample. An image is formed by synchronizing the collector signal with the scan. Alternatively, a CCD or CMOS device or devices can be used in place of the metal collector. In an embodiment, the CCD or CMOS device can image with the probe stationary or scanning. In an embodiment where the probe current is stationary, the detector 300 is capable of detecting electron diffraction patterns, which result in an angular distribution pattern of electrons ejected from the sample.

Figure 4A:
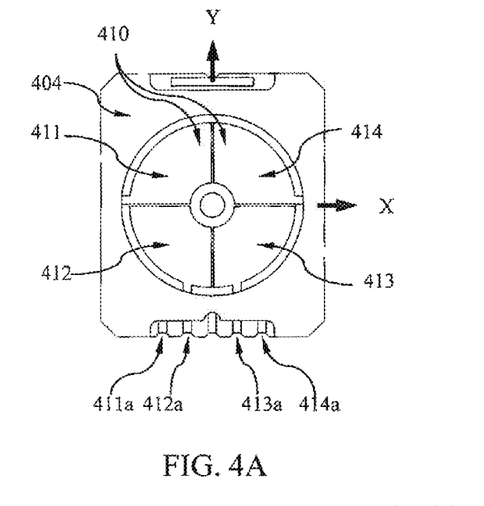
FIGS. 4A, 4B, and 4C are diagrams illustrating a layered MCP detector package showing top, exploded side, and bottom views, respectively.

FIGS. 4A, B and C further illustrate the detector package 320 shown as an example in FIG. 3. The detector package 320 is built layer by layer using LTCC technology and has four ceramic layers 401-404, two of which contain surface metallization. However, the total number of ceramic layers or metalized surfaces is not limited. The collector 410 located on the top surface of layer 403 is patterned in metal to form four electrically isolated segments 411-414. The four segments are symmetrically placed about the aperture bore 420 through which the charged particle beam 125 passes. Each segment can be contacted independently depending on the particular application through corresponding interconnect locations 411$a$-414$a$. A ground plane 430 is patterned in metal on the back surface of layer 401 and is used to provide an electrical connection to the central aperture. In this embodiment, metalized vias are not required due to the package simplicity. However, for more complicated collector patterns or with the addition of surface mount devices, vias can be used for internal trace routing and proper interconnect placement.

Figure 4B:
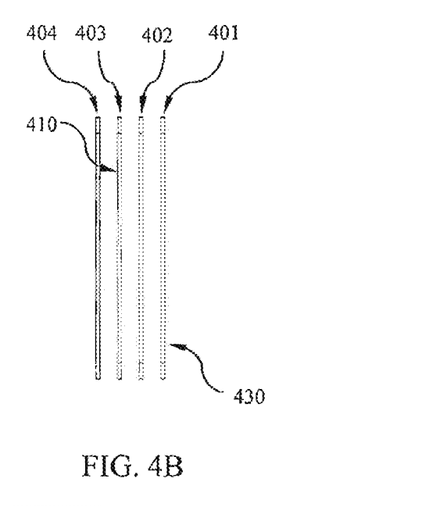
Figure 4C:
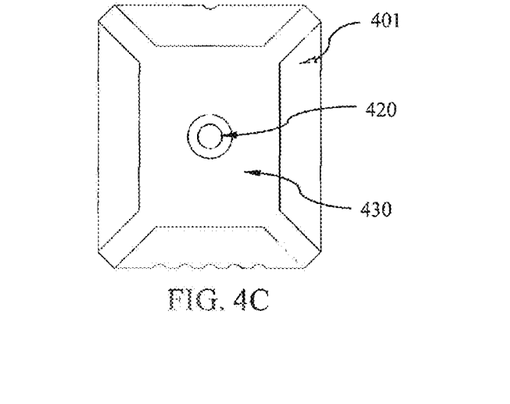

The formation of the image can be illustrated by a$S411$+b$S412$+c$S413$+d$S414$ where $S41x$ is the number of electrons collected by segment $41x$ (wherein x ranges from 1 to 4) and a, b, c, and d are coefficients. When the image is formed by summing the signals from each segment as represented by changing the values of the coefficients, the signal used to form the image can come from any single segment, from any combination of segments, or from a particular direction. For example, when a=b=c=d=1, the image is formed using signal from all segments of the collector. If all but one coefficient is zero, for example, a≠0 and b=c=d=0, then the image is formed using only $S411$. If two coefficients are negative and two are positive, for example, a=b=1 and c=d=−1, then the resulting image highlights features along a single axis. In the case where the sample contains a feature with topography oriented predominantly along the y-axis, electrons are ejected from the sample primarily in the x direction. Therefore, if the gap between detector and sample is small, the effect of collecting directional electrons is to enhance the topography. By differencing the signal in this way, electrons traveling in the x direction are weighted preferentially in the reconstructed image, resulting in enhanced contrast for features oriented in the y direction. Operating in this mode is called topographic imaging.

Figure 5:
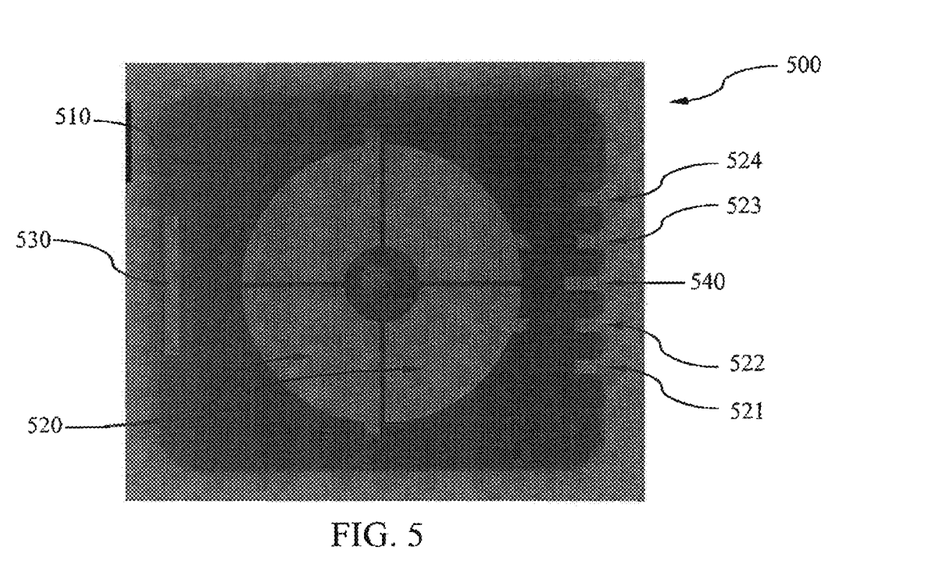
FIG. 5 is a photograph illustrating an MCP detector package fabricated from layered ceramic technologies.

FIG. 5 is a photograph illustrating a four quadrant detector 500 fabricated using LTCC technology. The total detector package is approximately 0.6 mm thick and comprises four ceramic layers 510, two containing surface metallization. A collector 520, collector traces and interconnects 521-524, bias interconnect 530, and high voltage interconnect 540 are all patterned onto the same layer without the need to use vias.

Figure 6:
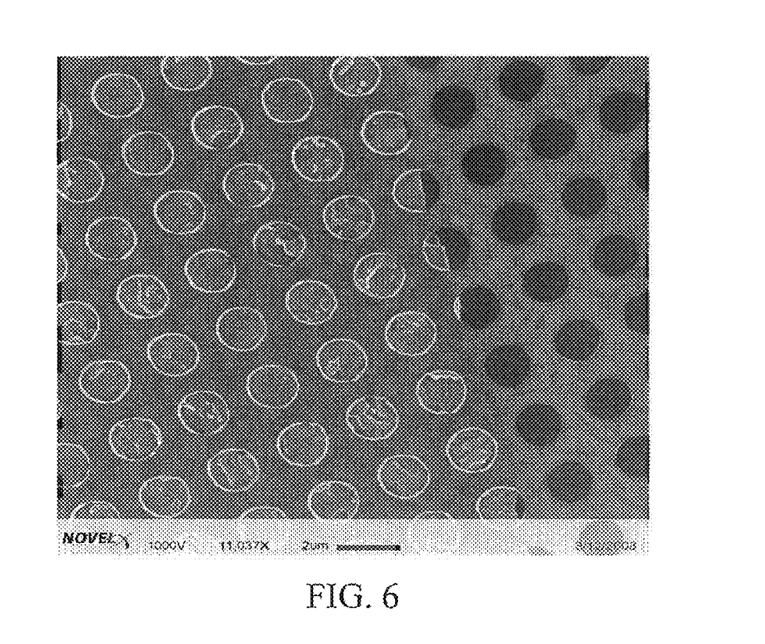
FIG. 6 is an Electron Micrograph illustrating the detector operating under a first condition.

FIG. 6 is an electron micrograph using the apparatus of FIG. 1, biased for secondary and backscattered electron collection. In this case, a=b=c=d=1 and all the electrons are collected.

Figure 7:
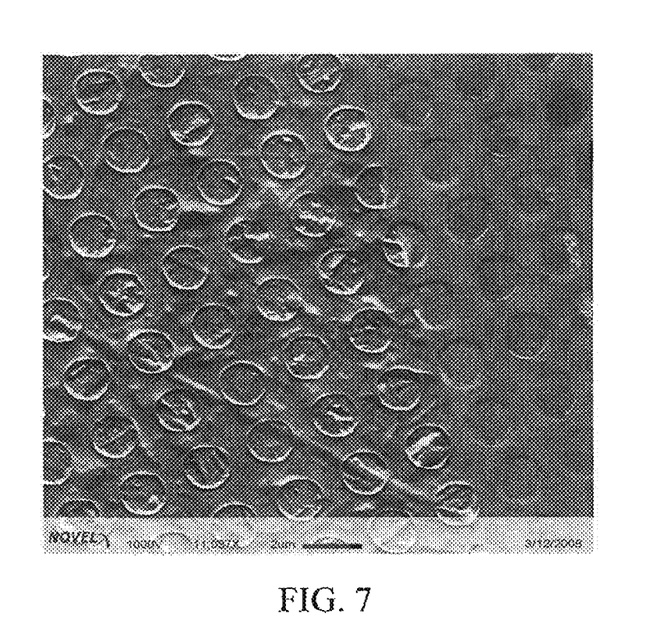
FIG. 7 is an Electron Micrograph illustrating the detector operating under a second condition.

FIG. 7 is an electron micrograph of the same feature in FIG. 6, instead using topographic enhancement mode where a=b=1 and c=d=−1.

Figure 8:
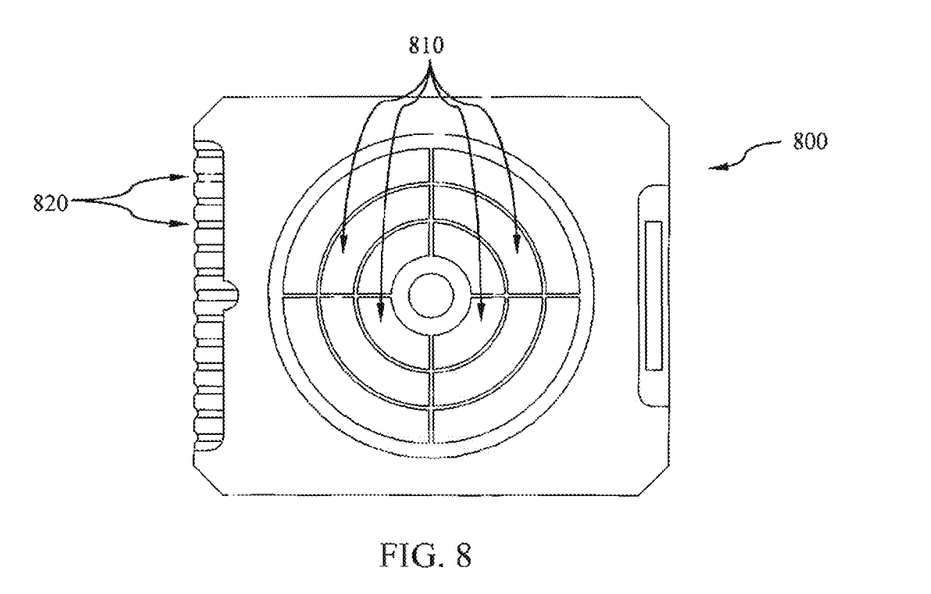
FIG. 8 is a diagram illustrating an alternate collector geometry, annulus/quadrant combination for the detector.

FIG. 8 is a diagram illustrating an embodiment of the MCP detector package 800 wherein a collector 810 is segmented in three electrically isolated annuluses, each concentric about the central aperture. Each annulus is then segmented into four additional quadrants. Due to the collector complexity, simple surface metallization is not adequate for providing a continuous isolated path to the collector interconnects 820. Instead, vias and internal traces are used. In this embodiment, 12 independent interconnects are needed to collect electrons from the corresponding segments of the collector 810. All electrons emanating from the sample can be collected. Alternatively, the electrons collected can be filtered and combined according only to their angular distribution, or by their angular and directional distribution. In this way, an image can be reconstructed to show the angular distribution of electrons ejected from the sample.

Figure 9:
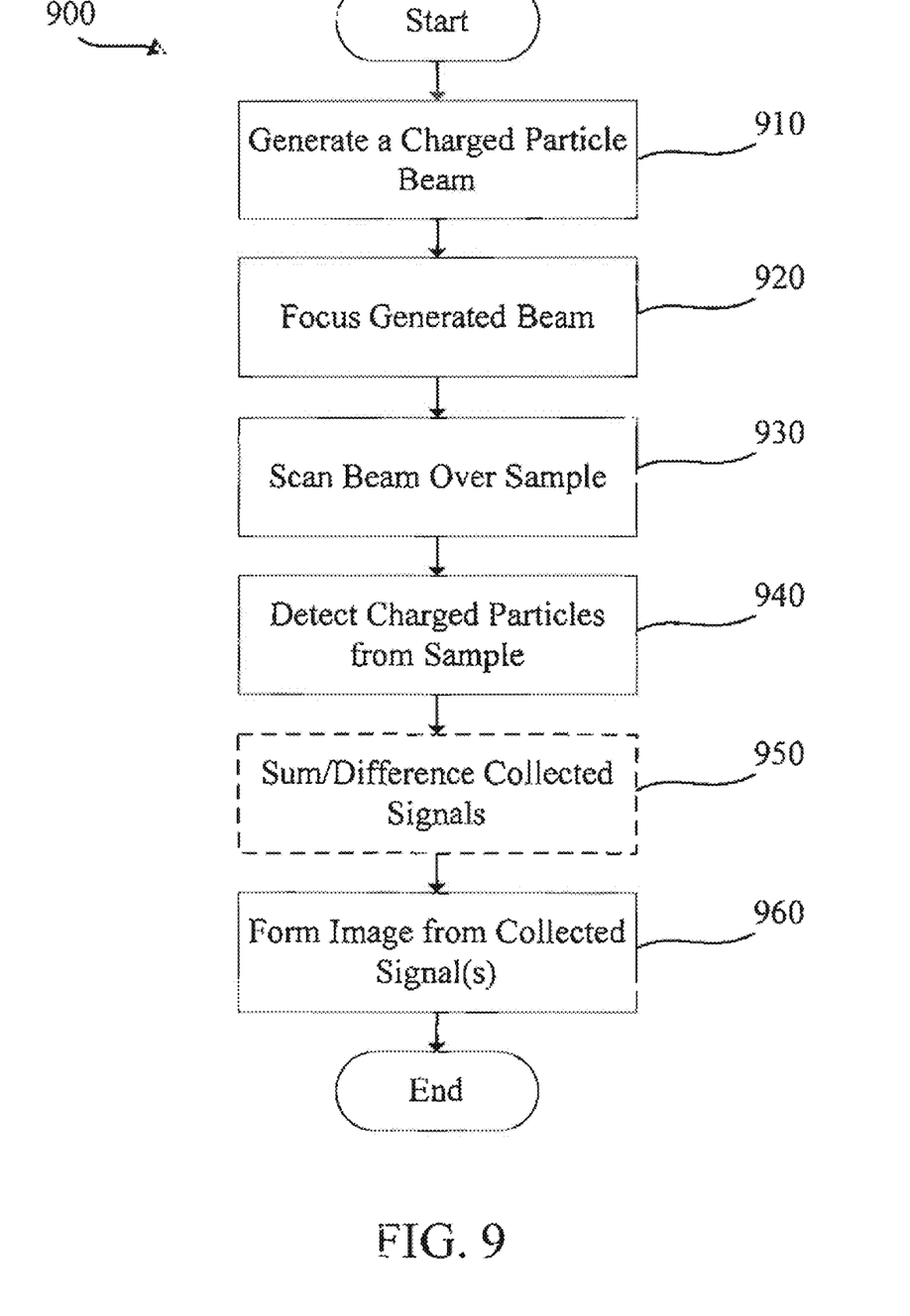
FIG. 9 is a flowchart illustrating a method of using the apparatus.

FIG. 9 is a flowchart illustrating a method 900 of using the apparatus. The method 900 comprises: generating (910) a charged particle beam; focusing (920) the beam with a charged particle beam column assembly (e.g., the beam column package 120 and components 121) onto a sample; scanning (930) the beam over the sample; detecting (940) charged particles from the sample with the detector; and forming (960) an image from the collected signal(s). In an embodiment, the method 900 further comprises summing (950) individual collector segment signals (positively or negatively such that the reconstructed image represents contrast resulting from electron trajectories primarily along a single axis).

The foregoing description of the illustrated embodiments of the present invention is by way of example only, and other variations and modifications of the above-described embodiments and methods are possible in light of the foregoing teaching. Further, components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A scanning charged particle microscope, comprising:
   a layered charged particle beam column package;
   a sample holder; and
   a layered micro-channel plate detector package located between the beam column package and the sample holder.

2. The microscope of claim 1, wherein the layers of the detector package are ceramic.

3. The microscope of claim 2, wherein the layers of the detector package are made of LTCC or HTCC.

4. The microscope of claim 1, wherein the detector comprises dual micro-channel plates and has an overall combined thickness of less than about 1.3 mm.

5. The microscope of claim 1, wherein a layer of the detector package includes a collector for collecting electrons.

6. The microscope of claim 5, wherein the collector comprises a plurality of isolated segments.

7. The microscope of claim 6, further comprising interconnects coupled to the collector segments for independently contacting each segment.

8. The microscope of claim 5, wherein the collector includes a CCD or CMOS cell.

9. The microscope of claim 1, wherein at least two layers of the layered detector package have surface metallization.

10. The microscope of claim 1, further comprising a collector, collector traces and interconnects, bias interconnects, and a high voltage interconnect all patterned onto a single layer of the detector package.

11. A method, comprising:
generating a charged particle beam;
focusing the beam with a charged particle beam column assembly onto a sample, the beam column assembly having a layered charged particle beam column package; a sample holder holding the sample; and a micro-channel plate detector, the detector having a layered detector package, located between the beam column assembly and the sample holder;
scanning the beam over the sample; and
detecting charged particles from the sample with the detector.

12. The method of claim 11, wherein the layers of the detector package are ceramic.

13. The method of claim 12, wherein the layers of the detector package are made of LTCC or HTCC.

14. The method of claim 11, wherein the detector comprises dual micro-channel plates and has an overall combined thickness of less than about 1.3 mm.

15. The method of claim 11, wherein a layer of the detector package includes a collector for collecting electrons.

16. The method of claim 15, wherein the collector comprises a plurality of isolated segments.

17. The method of claim 16, wherein the detector further comprises interconnects coupled to the segments for independently contacting each segment and wherein the method further comprises:
summing individual collector segment signals positively or negatively such that the reconstructed image represents contrast resulting from electron trajectories primarily along a single axis.

18. The method of claim 15, wherein the collector includes a CCD or CMOS cell.

19. The method of claim 11, wherein at least two layers of the layered detector package have surface metallization.

20. The method of claim 11, wherein the detector further comprises a collector, collector traces and interconnects, bias interconnects, and a high voltage interconnect all patterned onto a single layer of the detector package.

* * * * *